United States Patent
Kim et al.

(10) Patent No.: US 11,955,499 B2
(45) Date of Patent: Apr. 9, 2024

(54) IMAGE SENSOR PACKAGE INCLUDING GLASS SUBSTRATE AND A PLURALITY OF REDISTRIBUTION LAYERS DISPOSED BELOW THE GLASS SUBSTRATE AND SPACED APART FROM EACH OTHER BY A PREDETERMINED DISTANCE

(71) Applicant: SAMSUNG ELECTRONICS CO., LTD., Suwon-si (KR)

(72) Inventors: Minjung Kim, Cheonan-si (KR); Dongkyu Kim, Anyang-si (KR); Kyounglim Suk, Suwon-si (KR); Jaegwon Jang, Hwaseong-si (KR); Hyeonjeong Hwang, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 359 days.

(21) Appl. No.: 17/363,931

(22) Filed: Jun. 30, 2021

(65) Prior Publication Data
US 2022/0165778 A1    May 26, 2022

(30) Foreign Application Priority Data
Nov. 23, 2020    (KR) .................. 10-2020-0157673

(51) Int. Cl.
    *H01L 27/146*      (2006.01)
    *H01L 23/00*      (2006.01)

(52) U.S. Cl.
CPC .. *H01L 27/14636* (2013.01); *H01L 27/14618* (2013.01); *H01L 27/14634* (2013.01); *H01L 24/16* (2013.01); *H01L 27/14621* (2013.01); *H01L 27/14625* (2013.01); *H01L 2224/16227* (2013.01)

(58) Field of Classification Search
CPC ......... H01L 27/14636; H01L 27/14618; H01L 27/14634; H01L 24/16; H01L 27/14621; H01L 27/14625; H01L 2224/16227
See application file for complete search history.

(56) References Cited

U.S. PATENT DOCUMENTS

| | | | |
|---|---|---|---|
| 4,943,710 A * | 7/1990 | Sakama | H01L 31/1055 257/53 |
| 6,571,466 B1 * | 6/2003 | Glenn | H01L 27/14618 29/841 |
| 7,582,944 B2 | 9/2009 | Fukuda et al. | |

(Continued)

*Primary Examiner* — Lex H Malsawma
*Assistant Examiner* — Sean Ayers Winters
(74) *Attorney, Agent, or Firm* — F. CHAU & ASSOCIATES, LLC

(57) ABSTRACT

An image sensor package includes a glass substrate configured to focus incident light, a first redistribution layer and a second redistribution layer both disposed under the glass substrate while being horizontally spaced apart from each other by a first distance, an image sensor disposed such that an upper surface thereof is vertically spaced apart from both a lower surface of the first redistribution layer and a lower surface of the second redistribution layer by a second distance, and a first connector that connects both the first redistribution layer and the second redistribution layer to the image sensor. The thickness of the glass substrate is 0.6 to 0.8 mm. The first distance is smaller than the horizontal length of the image sensor by 50 μm to 1 mm. The second distance is equal to or less than 0.1 mm.

20 Claims, 17 Drawing Sheets

(56) References Cited

U.S. PATENT DOCUMENTS

| | | |
|---|---|---|
| 8,110,911 B2 | 2/2012 | Ishihara et al. |
| 8,211,750 B2 | 7/2012 | Ohsumi |
| 8,212,297 B1 | 7/2012 | Law et al. |
| 8,466,997 B2 | 6/2013 | Goh et al. |
| 9,214,592 B2 | 12/2015 | Oganesian |
| 10,204,947 B2 | 2/2019 | Chen et al. |
| 10,312,276 B2 | 6/2019 | Chien et al. |
| 10,446,504 B2 | 10/2019 | Cheng et al. |
| 10,451,876 B2 | 10/2019 | Jepsen |
| 2017/0194226 A1* | 7/2017 | Chen .................. H01L 21/4846 |
| 2018/0337142 A1* | 11/2018 | Cheng .................. H01L 23/04 |
| 2019/0348375 A1* | 11/2019 | Chou .................. H01L 24/16 |
| 2020/0098808 A1* | 3/2020 | Wu .................. H01L 27/14625 |
| 2020/0185826 A1* | 6/2020 | Park .................. H01Q 21/08 |

* cited by examiner

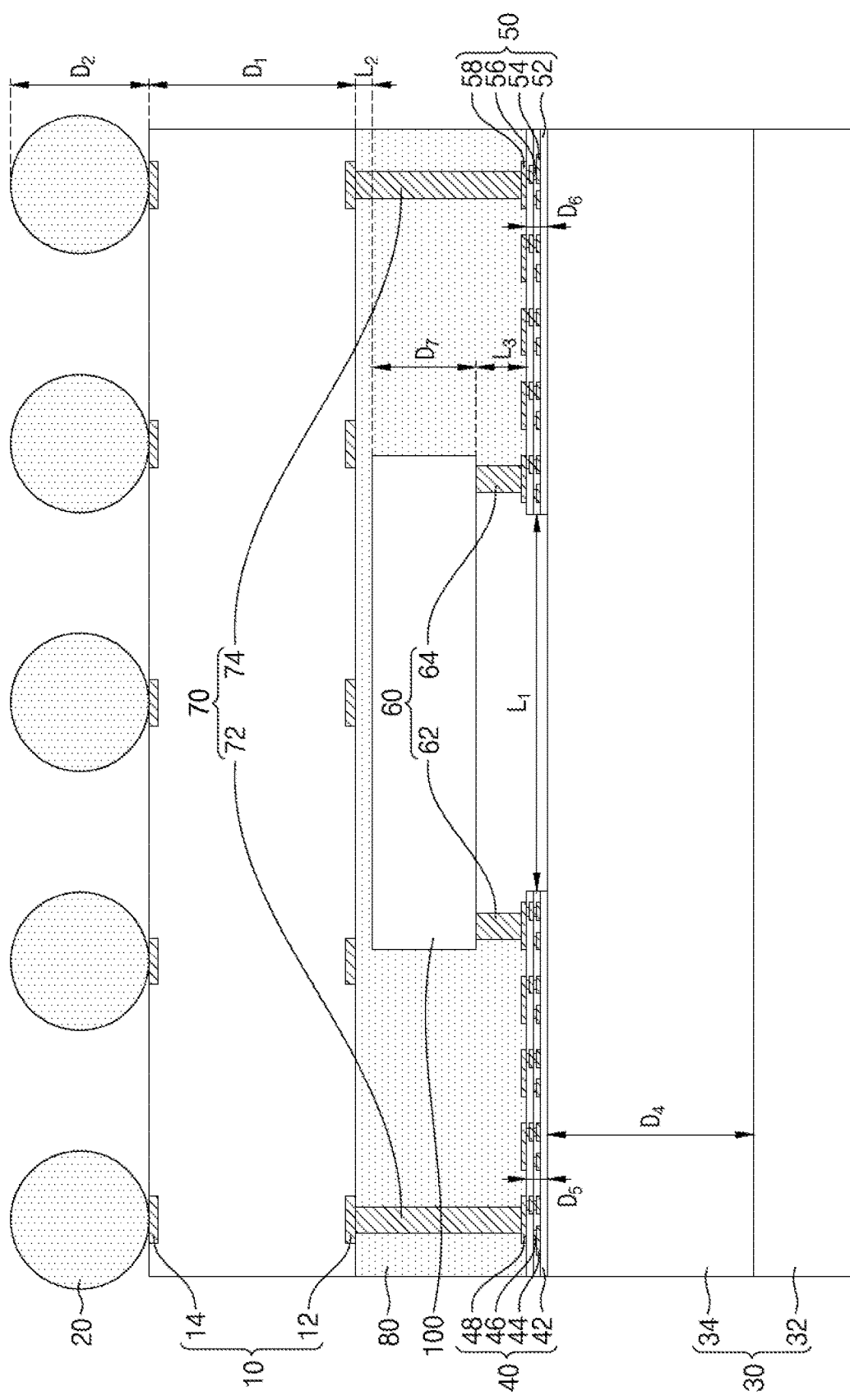

IMAGE SENSOR PACKAGE INCLUDING GLASS SUBSTRATE AND A PLURALITY OF REDISTRIBUTION LAYERS DISPOSED BELOW THE GLASS SUBSTRATE AND SPACED APART FROM EACH OTHER BY A PREDETERMINED DISTANCE

CROSS-REFERENCE TO THE RELATED APPLICATION

This application claims priority under 35 U.S.C. § 119 to Korean Patent Application No. 10-2020-0157673, filed on Nov. 23, 2020 in the Korean Intellectual Property Office, the disclosure of which is incorporated by reference herein in its entirety.

TECHNICAL FIELD

The present disclosure relates to an image sensor package. More particularly, the present disclosure relates to an image sensor package including a glass substrate.

DISCUSSION OF THE RELATED ART

Image sensors are used in electronic devices to convert optical information into electrical signals. Common image sensors include charge coupled device (CCD) image sensors and complementary metal-oxide semiconductor (CMOS) image sensors.

The complementary metal oxide semiconductor (CMOS) image sensor has applications not only for consumer electronics, such as digital cameras and mobile phones, but also for cameras mounted to vehicles, security devices and robots. Conventional CMOS sensors used in these applications may be subjected to external forces and general wear and tear; it is desired to develop sensors with secured and optimized signal integrity (SI) and power integrity (PI) characteristics, as well as reduced thickness.

SUMMARY

The present disclosure provides an image sensor package having a minimized thickness.

An image sensor package according to an embodiment of the present disclosure includes a glass substrate configured to focus incident light, a first redistribution layer and a second redistribution layer both disposed under the glass substrate while being horizontally spaced apart from each other by a first distance, an image sensor disposed such that an upper surface thereof is vertically spaced apart from both a lower surface of the first redistribution layer and a lower surface of the second redistribution layer by a second distance, and a first connector disposed between the first redistribution layer and the image sensor and further disposed between the second redistribution layer and the image sensor, to connect the first redistribution layer and the second redistribution layer to the image sensor. The thickness of the glass substrate is 0.6 to 0.8 mm. The first distance is less than a horizontal length of the image sensor by 50 μm to 1 mm, and the second distance is 0.1 mm or less.

An image sensor package according to an embodiment of the present disclosure includes a glass substrate configured to focus incident light, a first redistribution layer and a second redistribution layer both disposed under the glass substrate while being horizontally spaced apart from each other, an image sensor disposed such that an upper surface thereof is vertically spaced apart from both a lower surface of the first redistribution layer and a lower surface of the second redistribution layer by a first distance, a memory vertically spaced apart from the lower surface of the first redistribution layer by a second distance and horizontally spaced apart from the image sensor by a third distance, a first connector disposed between the first redistribution layer and the image sensor and further disposed between the second redistribution layer and the image sensor, to connect the first redistribution layer and the second redistribution layer to the image sensor, and a second connector disposed between the first redistribution layer and the memory to connect the first redistribution layer to the memory. The first distance and the second distance are both 0.1 mm or less, and the third distance is 50 to 300 μm.

An image sensor package according to an embodiment of the present disclosure includes a base substrate, an external connecting terminal disposed under the base substrate, an optical filter disposed on the base substrate, a glass substrate disposed under the optical filter, a first redistribution layer and a second redistribution layer both disposed under the glass substrate and horizontally spaced apart from each other by a first distance, an image sensor disposed such that a lower surface of the image sensor is vertically spaced apart from an upper surface of the base substrate by a second distance and such that an upper surface of the image sensor is vertically spaced apart from a lower surface of the second redistribution layer by a third distance, a first connector disposed between the first redistribution layer and the image sensor and further disposed between the second redistribution layer and the image sensor, to connect the first redistribution layer and the second redistribution layer to the image sensor, a second connector disposed outside the image sensor, to interconnect the base substrate, with the first redistribution layer and the second redistribution layer, and a molding part disposed outside the image sensor such that one side surface and the opposite side surface of the molding part are aligned with one side surface of the first redistribution layer and the aside surface of the second redistribution layer opposite to the one side surface of the first redistribution layer, respectively, and a portion of an inner side surface of the molding part contacts side and lower surfaces of the image sensor. A lower surface of the optical filter may be convex in a direction toward the image sensor convex in a direction opposite to the image sensor, and a lower surface of the glass substrate may also be convex in a direction toward the image sensor or in a direction opposite to the image sensor.

BRIEF DESCRIPTION OF THE DRAWINGS

The above and other aspects and features of the present disclosure will become more apparent by describing in detail exemplary embodiments thereof with reference to the attached drawings, in which:

FIGS. 13 to 16 are schematic cross-sectional views showing a method for manufacturing an image sensor package in accordance with an embodiment of the present disclosure.

DETAILED DESCRIPTION

Figure 1:
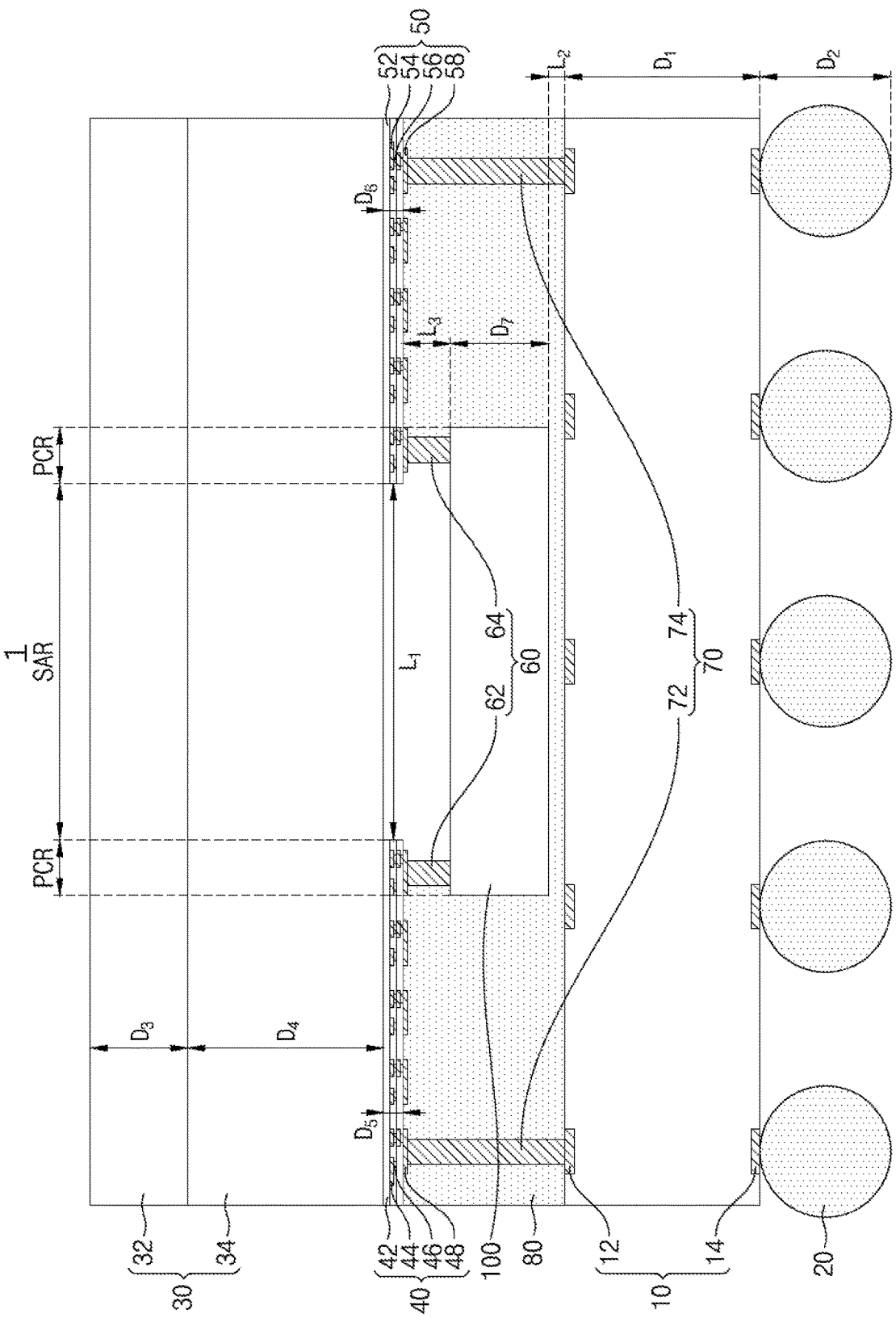
FIG. 1 is a cross-sectional view of an image sensor package according to an embodiment of the present disclosure.

Hereinafter, various example embodiments will be described in detail with reference to the accompanying drawings. Like reference symbols in the drawings may denote like elements, and to the extent that a description of an element has been omitted, it may be understood that the element is at least similar to corresponding elements that are described elsewhere in the specification. Additionally, description of a singular element may apply to a plurality of the same elements, unless the context of the description or referenced drawings indicates otherwise.

Further, when an element is stated to be "on" another element, the elements may be in direct contact with each other, or there may be interposing layers therebetween.

Figure 2:
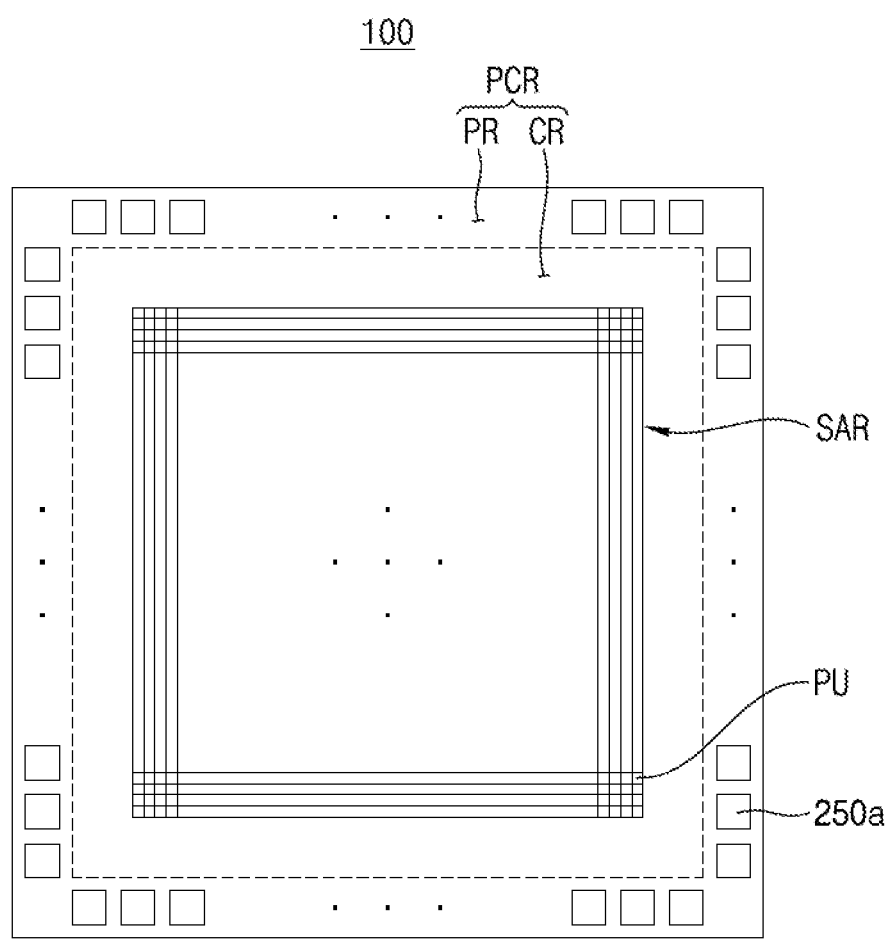
FIG. 2 is a plan view of an image sensor according to an embodiment of the present disclosure.
Figure 3:
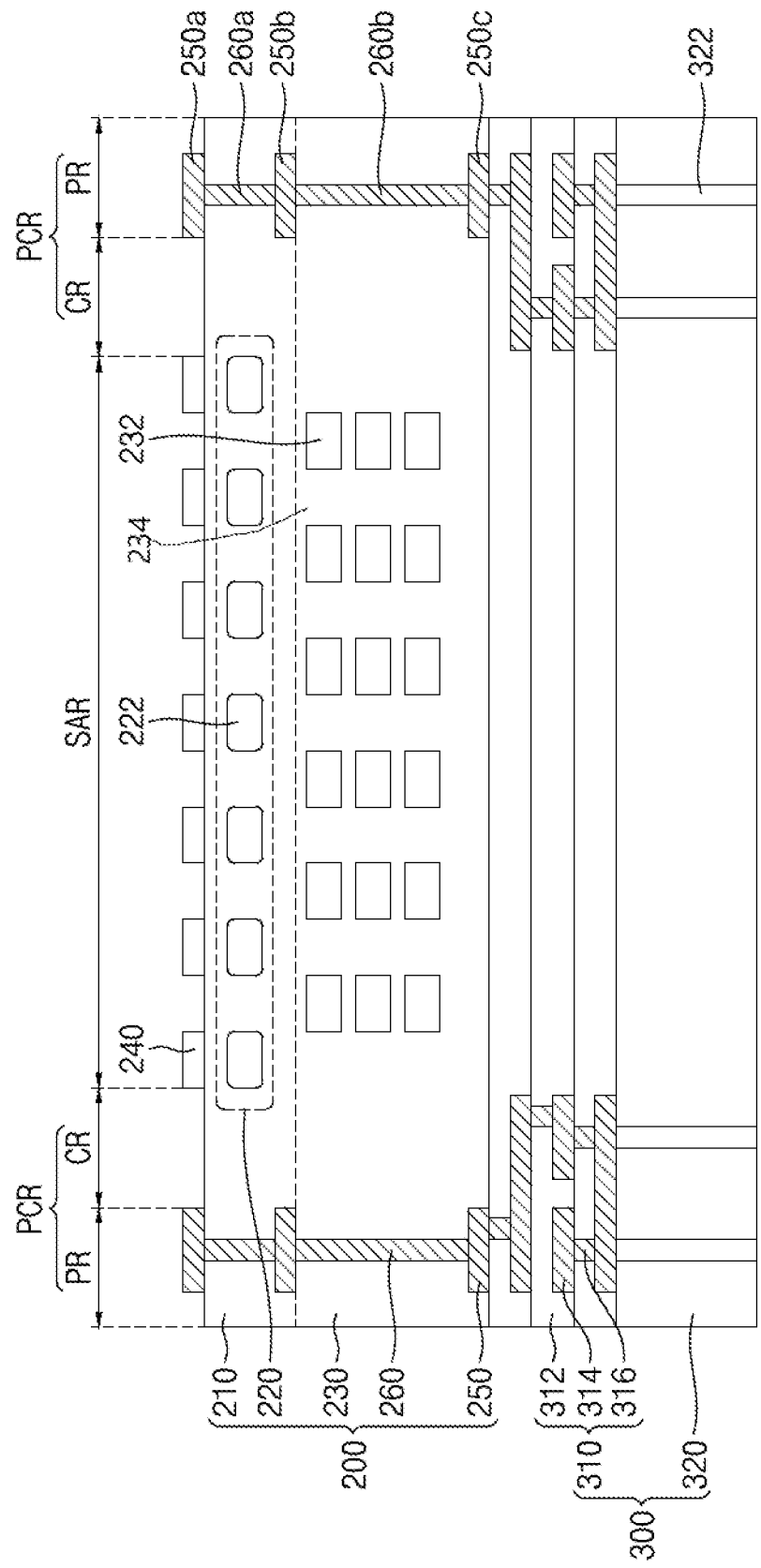
FIG. 3 is a cross-sectional view of the image sensor according to the embodiment of the present disclosure.

FIG. 1 is a cross-sectional view of an image sensor package according to an embodiment of the present disclosure. FIG. 2 is a plan view of an image sensor according to an embodiment of the present disclosure. FIG. 3 is a cross-sectional view of the image sensor according to the embodiment of the present disclosure.

Referring to FIGS. 1 to 3, an image sensor package 1 may include a base substrate 10, an external connecting terminal 20, a light supplier 30, a first redistribution layer 40, a second redistribution layer 50, an image sensor 100, a first connector 60, a second connector 70, and a molding part 80.

The base substrate 10 may be disposed under the image sensor package 1. A thickness $D_1$ of the base substrate 10 may be 0.5 to 0.7 mm. For example, in one embodiment, the thickness $D_1$ of the base substrate 10 may be 0.6 mm. The base substrate 10 may include a flexible printed circuit board (FPCB), a silicon-based substrate, a ceramic substrate, a glass substrate and/or an insulating circuit board. The base substrate 10 may include and/or function as a reinforcing plate, and may include a thermally conductive metal such as copper (Cu), silver (Ag), gold (Au), aluminum (Al), etc. The base substrate 10 may include an upper pad 12 and a lower pad 14.

The external connecting terminal 20 may be disposed under the base substrate 10. A thickness $D_2$ of the external connecting terminal 20 may be 0.3 to 0.5 mm. In an embodiment, the thickness $D_2$ of the external connecting terminal 20 may be 0.37 mm. The external connecting terminal 20 may be connected to the lower pad 14. For example, the external connecting terminal 20 may be a solder ball or a solder bump. In this case, the thickness $D_2$ of the external connecting terminal may refer to a diameter of the solder ball or solder bump. The external connecting terminal 20 may electrically connect the image sensor package 1 to the outside. As used herein, "the outside" may refer to anything external to the currently described embodiment. For example, something coming from "the outside" may describe something coming from the environment.

The light supplier 30 may include an optical filter 32 and a glass substrate 34. The optical filter 32 may be disposed at an upper end of the image sensor package 1. The optical filter 32 may be disposed on the base substrate 10. Although the horizontal length of the optical filter 32 is shown as substantially equal to the horizontal length of the glass substrate 34 in the drawings, the horizontal length of the optical filter 32 may be, for example, smaller than the horizontal length of the glass substrate 34. When the horizontal length of the optical filter 32 is minimized, a side surface of the optical filter 32 may be aligned with inner side surfaces of the first redistribution layer 40 and the second redistribution layer 50. The optical filter 32 may be an infrared filter.

A thickness $D_3$ of the optical filter 32 may be about 0.5 mm. The optical filter 32 may be irradiated with light from the outside. The optical filter 32 may filter the irradiated light. For example, when the optical filter 32 is an infrared filter, the optical filter 32 may transmit light in an infrared range from the irradiated light while substantially filtering out light outside of the infrared range.

The glass substrate 34 may be disposed under the optical filter 32. An upper surface of the glass substrate 34 may contact a lower surface of the optical filter 32. A side surface of the glass substrate 34 may be aligned with the side surface of the optical filter 32. However, in some embodiments, the optical filter 32 may have a minimized length, and the side surface of the glass substrate 34 might not be aligned with the side surface of the optical filter 32. A thickness $D_4$ of the glass substrate 34 may be 0.6 to 0.8 mm.

The glass substrate 34 may include silicon. The glass substrate 34 may be a transparent substrate. The glass substrate 34 may function as a microlens. For example, light from the optical filter 32 may be supplied to the glass substrate 34, the light may be filtered by the optical filter 32, and the glass substrate 34 may focus the light supplied from the optical filter 32.

The relative aperture of the image sensor package 1 may be adjusted on the basis of the glass substrate 34. The relative aperture may be a ratio between a maximum effective aperture of a lens and a focal length of the lens. Here, the lens may be the glass substrate 34, and the focal length of the lens may be adjusted in accordance with the shape and thickness of the glass substrate 34.

The first redistribution layer 40 may be disposed under the light supplier 30. An upper surface of the first redistribution layer 40 may contact a lower surface of the glass substrate 34. The first redistribution layer 40 may be disposed at a first side of the light supplier 30. One side surface of the first redistribution layer 40 may be aligned with one side surface of the glass substrate 34. A thickness $D_5$ of the first redistribution layer 40 may be 0.01 to 0.05 mm.

The first redistribution layer 40 may include an insulating layer 42, a redistribution pattern 44, a conductive via 46, and a conductive pad 48. The insulating layer 42 may be stacked in plural and, as such, the redistribution pattern 44 may be disposed on a lower surface of each insulating layer 42, thereby forming a multilayer structure. The conductive via 46 may interconnect the redistribution patterns 44 in the multilayer structure. The conductive pattern 48 may be disposed on a surface of an uppermost one of the insulating layers 42.

The insulating layer 42 may include Ajinomoto build-up film (ABF), epoxy, or polyimide. The insulating layer 42 may include photosensitive polymer. For example, the photosensitive polymer may include one or more of: a photosensitive polyimide, polybenzeoxazole, a phenol-based polymer and a benzocyclobutene-based polymer. The redistribution pattern 44, the conductive via 46 and the conductive pad 48 may include a conductive material, for example, copper, nickel, stainless steel or a copper alloy such as beryllium copper.

The second redistribution layer 50 may also be disposed under the light supplier 30. An upper surface of the second redistribution layer 50 may contact the lower surface of the glass substrate 34. The second redistribution layer 50 may be disposed at a second side of the light supplier 30, opposite to the first side. For example, both the first redistribution layer 40 and the second redistribution layer 50 may be disposed below the light supplier 30, but the first redistribution layer 40 may be disposed at an edge portion under the light supplier 30, and the second redistribution layer 50 may be disposed at an opposite edge portion under the light supplier 30. An outer side surface of the second redistribution layer 50 may be aligned with the other side surface of the glass substrate 34. The second redistribution layer 50 may be spaced apart from the first redistribution layer 40 by a first distance $L_1$ in a horizontal direction. For example, the first distance $L_1$ may be smaller than a horizontal length $W_1$ of the image sensor 100 by 50 μm to 1 mm.

A thickness $D_6$ of the second redistribution layer 50 may be equal to the thickness $D_5$ of the first redistribution layer 40. The second redistribution layer 50 may include an insulating layer 52, a redistribution pattern 54, a conductive via 56 and a conductive pad 58. The insulating layer 52, the redistribution pattern 54, the conductive via 56 and the conductive pad 58 may be substantially identical to the insulating layer 42, the redistribution pattern 44, the conductive via 46 and the conductive pad 48 of the first redistribution layer 40, respectively.

The first redistribution layer 40 and the second redistribution layer 50 may function as an iris of the image sensor package 1. In this case, the diameter of the iris may be the first distance $L_1$ that is the distance between the first redistribution layer 40 and the second redistribution layer 50. The relative aperture of the image sensor package 1 may be adjusted by changing the first distance $L_1$. As the first distance $L_1$ increases, the effective aperture of the image sensor package 1 may be increased. By contrast, as the first distance $L_1$ decreases, the effective aperture of the image sensor package may be decreased.

The image sensor 100 may be disposed between the base substrate 10 and the light supplier 30. For example, the image sensor 100 may be disposed at a central portion of the base substrate 10. In one embodiment, the horizontal length $W_1$ of the image sensor 100 may be 50 mm or less. A lower surface of the image sensor 100 may be spaced apart from an upper surface of the base substrate 10 by a second distance $L_2$ in a vertical direction. For example, the second distance $L_2$ may be 0.1 mm or less. An upper surface of the image sensor 100 may be spaced apart from a lower surface of the first redistribution layer 40 and a lower surface of the second redistribution layer 50 by a third distance $L_3$ in a vertical direction. For example, the third distance $L_3$ may be 0.1 mm or less.

A thickness $D_7$ of the image sensor 100 may be 0.2 to 0.4 mm. The image sensor 100 may include a complementary metal oxide semiconductor (CMOS) image sensor.

Referring to FIG. 2, the image sensor 100 may include a sensor array region SAR and a peripheral circuit region PCR. The peripheral circuit region PCR may include a circuit region CR and a pad region PR.

The sensor array region SAR may include a pixel array PA. The pixel array PA may include a plurality of unit pixel regions PU disposed in a matrix. Each unit pixel region PU may include a plurality of photoelectric converters (photodiodes) and a plurality of transistors. The pixel array PA may receive light from the outside, and may convert the received light into electrical signals.

The circuit region CR may be disposed along an edge portion of the sensor array region SAR. The circuit region CR may overlap vertically with the sensor array region SAR under the sensor array region SAR. For example, in a top-down plan view, the sensor array region SAR may partially obscure the circuit region CR. The circuit region CR may process an electrical signal produced by the pixel array PA. The pad region PR may be disposed along an outer edge of the circuit region CR. For example, in a plan view, the pad region PR may be disposed along all lateral sides of the circuit region CR. The pad region PR may include a first conductive pad 250a configured to transmit and receive electrical signals with an external device.

Referring to FIG. 3, the image sensor 100 may include an image sensor chip 200 and a processor 300. The image sensor chip 200 may include a substrate 210, a photoelectric conversion layer 220, a wiring layer 230, a color filter 240, a conductive pad 250, and a conductive via 260. The substrate 210 may be disposed at an upper portion of the image sensor chip 200. The substrate 210 may be and/or include a silicon substrate, a bulk silicon substrate, or a silicon-on-insulator (SOI) substrate. When the substrate 210 is a silicon substrate, the substrate 210 may include at least one of: silicon germanium, indium antimonide, a lead telluride compound, indium arsenide, indium phosphide, gallium arsenide, and gallium antimonide.

The photoelectric conversion layer 220 may be formed in the substrate 210. The photoelectric conversion layer 220 may include a photoelectric converter 222. The photoelectric converter 222 may be disposed in the sensor array region SAR. The photoelectric converter 222 may be provided in plural. For example, the photoelectric converter 222 may be provided for each unit pixel region PU. The photoelectric converter 222 may include a plurality of impurity regions (not shown) doped with an n-type impurity or a p-type impurity. For example, the photoelectric converter 222 may be configured in the form of a photodiode.

The photoelectric conversion layer 220 may include an n-type or p-type epitaxial layer in the area where the photoelectric converter 222 is not disposed. In the n-type or p-type epitaxial layer, an n-type deep well may be formed through ion implantation of an n-type impurity in a high concentration, or a p-type deep well may be formed through ion implantation of a p-type impurity in a high concentration.

The wiring layer 230 may be disposed at a lower portion of the image sensor chip 200. An upper surface of the wiring layer 230 may contact a lower surface of the substrate 210. The wiring layer 230 may include metal layers 232 and insulating layers 234. The metal layers 232 may constitute a wiring structure. The insulating layers 234 may be disposed between the metal layers 232.

For example, each metal layer 232 may include a metal material such as copper (Cu), aluminum (Al) or tungsten (W). Each insulating layer 234 may include at least one of: a high-density plasma (HDP) oxide film, a tetraethoxysilane (TEOS) oxide film, a Tonen silazane (TOSZ), spin-on-glass (SOG), undoped silica glass (USG), and a low-k dielectric layer.

The color filter 240 may be disposed on the substrate 210. A lower surface of the color filter 240 may contact an upper surface of the substrate 210. The color filter 240 may be disposed in the sensor array region SAR. The color filter 240 may be provided in plural. For example, the color filter 240 may be disposed for each unit pixel region PU. The color filter 240 may include a red filter, a blue filter and a green filter. In another embodiment, the color filter 240 may include a cyan filter, a yellow filter and a magenta filter.

The conductive pad 250 may include a first conductive pad 250a, a second conductive pad 250b and a third conductive pad 250c. The first conductive pad 250a may be disposed on the substrate 210. A lower surface of the first conductive pad 250a may contact the upper surface of the substrate 210. The first conductive pad 250a may be disposed at one end portion and at an opposite end portion of the substrate 210. The first conductive pad 250a may electrically connect the image sensor 100 to the first redistribution layer 40 and the second redistribution layer 50. The second conductive pad 250b may be disposed on the lower surface of the substrate 210. A lower surface of the second conductive pad 250b may contact the lower surface of the substrate 210. For example, the second conductive pad 250b may be disposed within the substrate 210, as opposed to underneath the substrate 210. The second conductive pad 250b may be disposed at one end portion and at an opposite end portion of the substrate 210.

The third conductive pad 250c may be disposed on a lower surface of the wiring layer 230. A lower surface of the third conductive pad 250c may contact the lower surface of the wiring layer 230. For example, the third conductive pad 250c may be disposed within the wiring layer 230, as opposed to underneath the wiring layer 230. The third conductive pad 250c may be disposed at one end portion and at an opposite end portion of the wiring layer 230. The third conductive pad 250c may electrically interconnect the image sensor chip 200 and the processor 300.

The conductive via 260 may include a first conductive via 260a and a second conductive via 260b. The first conductive via 260a may extend through the substrate 210. The first conductive via 260a may be disposed near one side of the substrate 210, and another first conductive via 260a may be disposed near the opposite side of the substrate 210. The first conductive via 260a may electrically interconnect the first conductive pad 250a and the second conductive pad 250b. The second conductive via 260b may extend through the wiring layer 230. The second conductive via 260b may be disposed near one side of the substrate 210, and another second conductive via 260a may be disposed near the opposite of the wiring layer 230. The second conductive via 260b may electrically interconnect the second conductive pad 250b and the third conductive pad 250c.

The image sensor chip 200 may receive light through the color filter 240. The light may be light focused by the glass substrate 34. The image sensor chip 200 may produce an electrical signal by processing the received light through the photoelectric conversion layer 220 and the wiring layer 230.

The processor 300 may be disposed under the image sensor chip 200. For example, the image sensor chip 200 and the processor 300 may be attached to each other through a wafer-to-wafer bonding process. The processor 300 may include a redistribution layer 310 and a wiring structure layer 320.

The redistribution layer 310 may be disposed at an upper portion of the processor 300. The redistribution layer 310 may include an insulating layer 312, a redistribution pattern 314 and a conductive via 316. The insulating layer 312 may be stacked in plural and, as such, the redistribution pattern 314 may disposed on an upper surface of each insulating layer 312, thereby forming a multilayer structure. The conductive via 316 may interconnect the redistribution patterns 314.

The wiring structure layer 320 may be disposed at a lower portion of the processor 300. An upper surface of the wiring structure layer 320 may contact a lower surface of the redistribution layer 310. The wiring structure layer 320 may include a through-silicon via (TSV) contact 322. The TSV contact 322 may be provided in plural. The TSV contacts 322 may extend vertically through the wiring structure layer 320. A part of the TSV contacts 322 may be electrically connected to the redistribution layer 310. For example, a part of each of the TSV contacts 322 may be electrically connected to the redistribution pattern 314.

The wiring structure layer 320 may include a wiring structure constituted by various logic circuits including analog intellectual property (IP) such as a digital signal processor (DSP), a processor core IP, an analog-to-digital converter (ADC), a digital-to-analog converter (DAC), or a phase-locked loop (PLL). The wiring structure layer 320 may further include an insulating film to insulate wiring structures from each other. The wiring structure layer 320 may process a signal output from the image sensor chip 200. The wiring structure layer 320 may produce a processing signal which results of the signal processing.

Referring to FIG. 1, the first connector 60 may include a first vertical connecting member 62 and a second vertical connecting member 64. Each of the first vertical connecting member 62 and the second vertical connecting member 64 may be a conductive via.

The first vertical connecting member 62 may be disposed on the lower surface of the first redistribution layer 40. The first vertical connecting member 62 may be disposed at an inside portion of the first redistribution layer 40. For example, the inside portion of the first redistribution layer 40 may be closer to the image sensor 100 than an outside portion of the first redistribution layer 40. The first vertical connecting member 62 may be disposed between the first redistribution layer 40 and the image sensor 100. The first vertical connecting member 62 may electrically interconnect the first redistribution layer 40 and the image sensor 100. The first vertical connecting member 62 may electrically interconnect the conductive pad 48 at the inside portion of the first redistribution layer 40 and the first conductive pad 250a at one side of the image sensor 100. The processing signal may be transmitted from the image sensor 100 to the first redistribution layer 40 through the first vertical connecting member 62.

The second vertical connecting member 64 may be disposed on the lower surface of the second redistribution layer 50. The second vertical connecting member 64 may be disposed at an inside portion of the second redistribution layer 50. The second vertical connecting member 64 may be disposed between the second redistribution layer 50 and the image sensor 100. The second vertical connecting member 64 may electrically interconnect the second redistribution layer 50 and the image sensor 100. The second vertical connecting member 64 may electrically interconnect the conductive pad 58 at the inside portion of the second redistribution layer 50 and the first conductive pad 250a at the other side of the image sensor unit 100. The processing signal may be transmitted from the image sensor 100 to the second redistribution layer 50 through the second vertical connecting member 64.

The second connector 70 may include a first long vertical connecting member 72 and a second long vertical connecting member 74. Each of the first long vertical connecting member 72 and the second vertical connecting member may be a conductive via.

The first long vertical connecting member 72 may be disposed on the lower surface of the first redistribution layer 40. The first long vertical connecting member 72 may be disposed at an outside portion of the first redistribution layer 40. The first long vertical connecting member 72 may be disposed between the base substrate 10 and the first redistribution layer 40. The first long vertical connecting member 72 may electrically interconnect the base substrate 10 and the first redistribution layer 40. The first long vertical connecting member 72 may electrically interconnect the upper pad 12 near side of the base substrate 10 and the conductive pad 48 at the outside portion of the first redistribution layer 40. The processing signal may be transmitted from the first redistribution layer 40 to the base substrate 10 through the first long vertical connecting member 72.

The second long vertical connecting member 74 may be disposed on the lower surface of the second redistribution layer 50. The second long vertical connecting member 74 may be disposed at an outside portion of the second redistribution layer 50. The second long vertical connecting member 74 may be disposed between the base substrate 10 and the second redistribution layer 50. The second long vertical connecting member 74 may electrically interconnect the base substrate 10 and the second redistribution layer 50. The second long vertical connecting member 74 may electrically interconnect the upper pad 12 at the other side of the base substrate 10 and the conductive pad 58 at the outside portion of the second redistribution layer 50. The processing signal may be transmitted from the second redistribution layer 50 to the base substrate 10 through the second long vertical connecting member 74.

The molding part 80 may be disposed in a space bounded the base substrate 10, the first redistribution layer 40, the second redistribution layer 50 and the image sensor 100. An upper surface of the molding part 80 may contact the lower surface of the first redistribution layer 40 and the lower surface of the second redistribution layer 50. A lower surface of the molding part 80 may contact the upper surface of the base substrate 10. One side surface of the molding part 80 may be aligned with a first side surface of the base substrate 10 and an outer side surface of the first redistribution layer 40. The other side surface of the molding part 80 may be aligned with a second side surface of the base substrate 10 opposite to the first side surface and the outer side surface of the second redistribution layer 50. An inner side surface of the molding part 80 may contact an outer side surface of the first connector 60 as well as side and lower surfaces of the image sensor 100. The molding part 80 may surround the second connector 70, which includes the first long vertical connecting member 72 and the second long vertical connecting member 74. The thickness of the molding part 80 may be equal to the sum of the second distance $L_2$, the third distance $L_3$ and the thickness $D_7$ of the image sensor 100. The thickness of the molding part 80 may be 0.1 to 0.5 mm.

The molding part 80 may include an epoxy molding compound (EMC), a thermoplastic resin such as polyimide, or another resin formed by containing a reinforcement material in the EMC or the thermoplastic resin, for example, an Ajinomoto build-up film (ABF), FR-4. BT resin, or the like. In addition, the molding part 80 may include a molding material such as EMC or a photosensitive material such as a photo-imageable encapsulant (PIE).

Figure 4A:
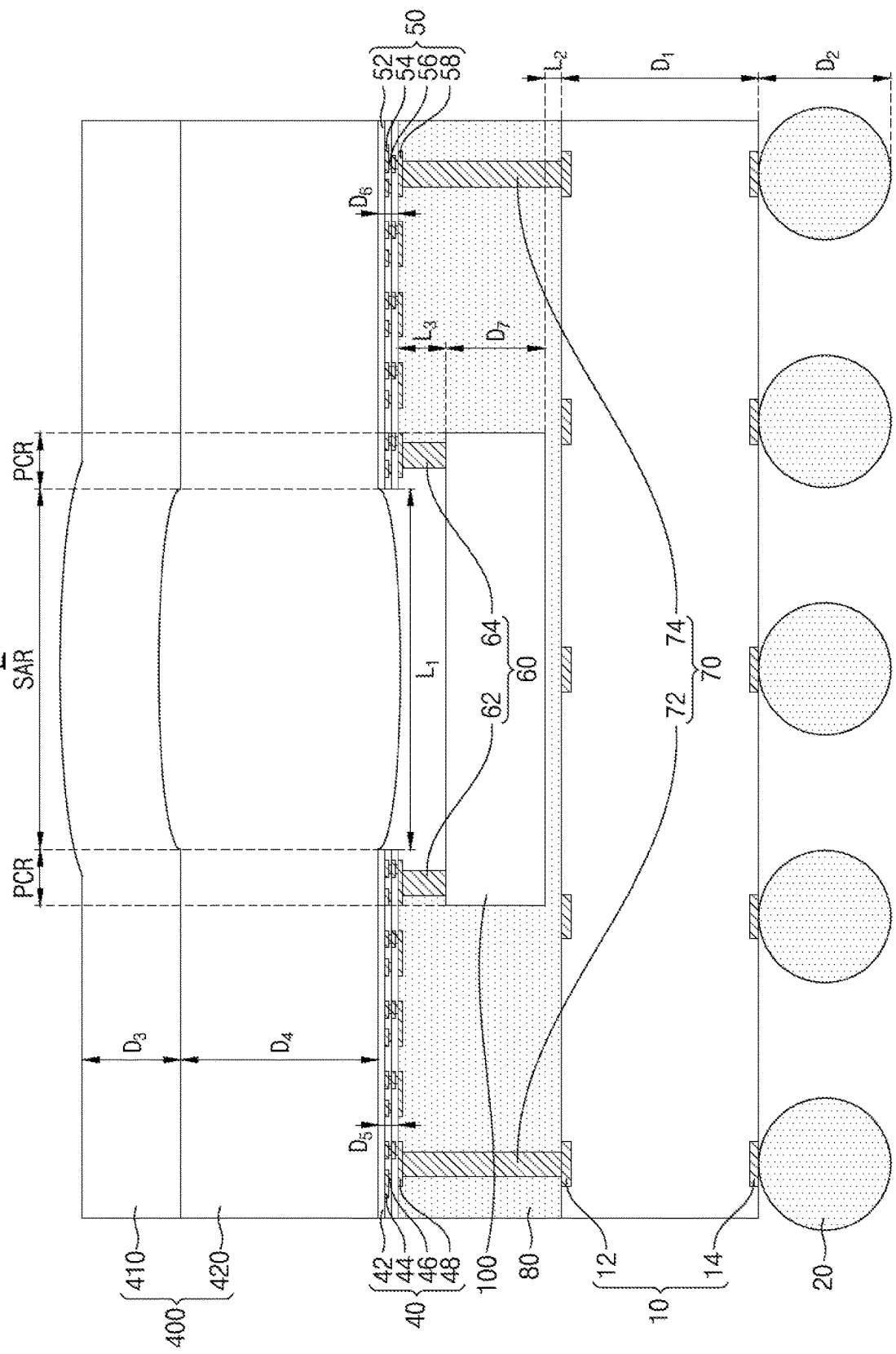
FIGS. 4A and 4B are cross-sectional views of image sensor packages according to embodiments of the present disclosure.
Figure 4B:
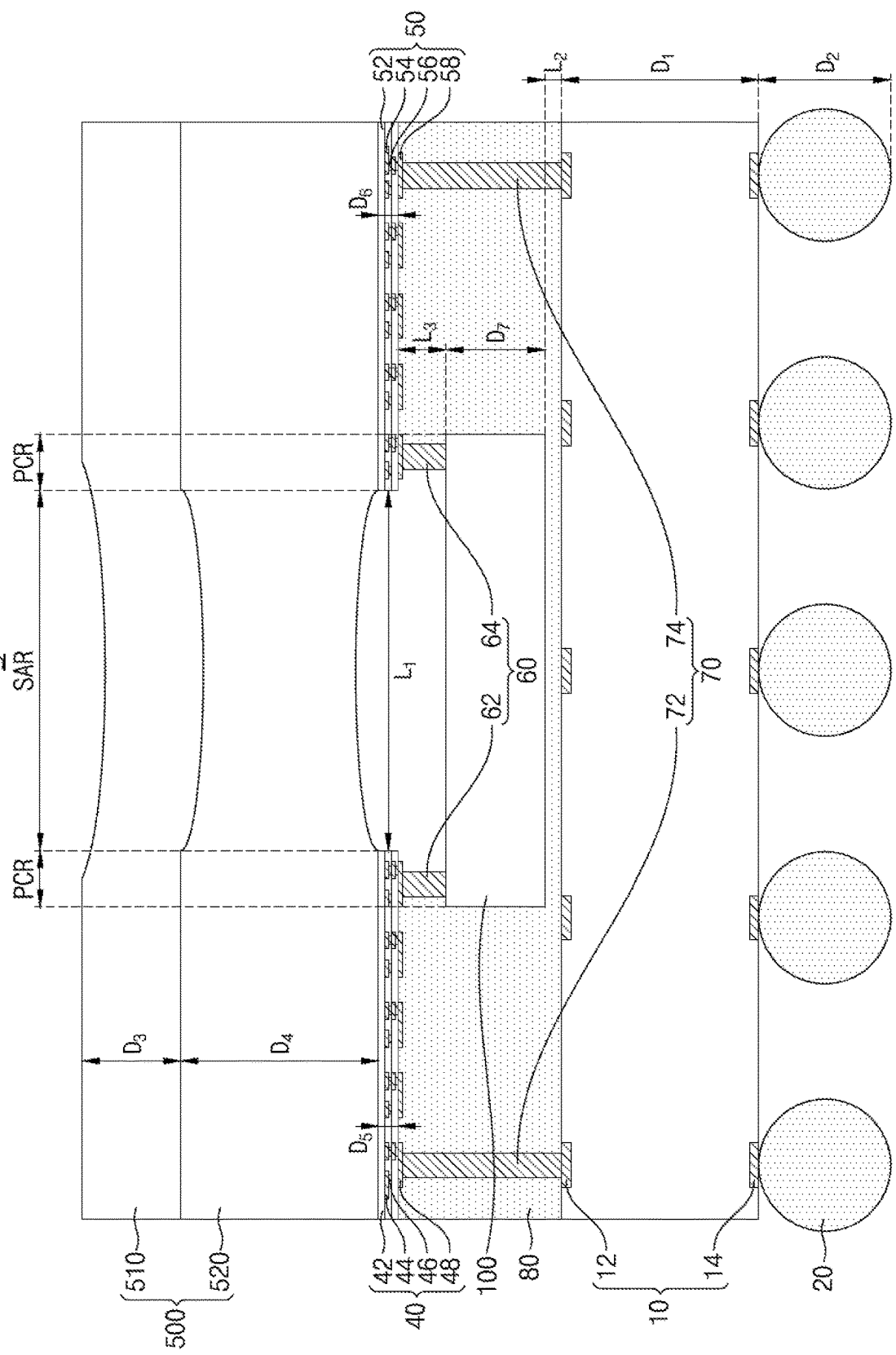

FIGS. 4A and 4B are cross-sectional views of image sensor packages according to embodiments of the present disclosure.

Referring to FIGS. 4A and 4B, image sensor packages 2 and 3 may each include a base substrate 10, an external connecting terminal 20, a first redistribution layer 40, a second redistribution layer 50, an image sensor 100, a first connector 60, a second connector 70, a molding part 80, and a light supplier 400 or 500. The base substrate 10, the external connecting terminal 20, the first redistribution layer 40, the second redistribution layer 50, the image sensor 100, the first connector 60, the second connector 70 and the molding part 80 may be identical or at least similar to the base substrate 10, the external connecting terminal 20, the first redistribution layer 40, the second redistribution layer 50, the image sensor 100, the first connector 60, the second connector 70 and the molding part 80 of FIGS. 1 to 3, respectively.

Herein, when a surface is described as either convex or concave "toward" or "in" a certain direction, this may describe a surface that bends or bulges in the stated direction.

Referring to FIG. 4A, the light supplier 400 may include an optical filter 410 and a glass substrate 420. A part of the optical filter 410 may have a shape convex in a direction opposite to the image sensor 100, and the remaining part of the optical filter 410 may have a flat shape. For example, a center portion of the optical filter 410 corresponding to a sensor array region SAR of the image sensor 100 may have a shape convex in a direction opposite to the image sensor 100, and the remaining portion, for example, edge portions, of the optical filter 410 may have a flat shape.

A part of a lower surface of the glass substrate 420 has a shape convex toward the image sensor 100, and a part of an upper surface of the glass substrate 420 that substantially vertically overlaps with lower surface part may have a shape convex in a direction opposite to the image sensor 100. For example, the glass substrate 420 has a convex shape at an upper portion thereof corresponding to the sensor array region SAR of the image sensor 100 while having a flat shape at the remaining upper portion thereof. The glass substrate 420 may function as a convex lens. When the glass substrate 420 functions as a convex lens, the focal length of the glass substrate 420 may increase as a thickness $D_4$ of the glass substrate 420 increases and, as such, the relative aperture of the image sensor package 2 may be adjusted.

Referring to FIG. 4B, the light supplier 500 may include an optical filter 510 and a glass substrate 520. A part of the optical filter 510 may have a shape concave toward the image sensor 100, and the remaining part of the optical filter 510 may have a flat shape. For example, a portion of the optical filter 510 corresponding to a sensor array region SAR of the image sensor 100 may have a shape convex toward the image sensor 100, and the remaining portion of the optical filter 510 may have a flat shape.

A part of an upper surface of the glass substrate 520 has a shape concave toward the image sensor 100, and a part of a lower surface of the glass substrate 520 corresponding to the upper surface part may have a shape concave in a direction opposite to the image sensor 100. For example, the glass substrate 520 has a concave shape at an upper portion thereof corresponding to the sensor array region SAR of the image sensor 100 while having a flat shape at the remaining upper portion thereof. The glass substrate 520 may function as a concave lens. When the glass substrate 520 functions as a concave lens, the focal length of the glass substrate 520 may decrease as a thickness $D_4$ of the glass substrate 520 increases and, as such, the relative aperture of the image sensor package 3 may be adjusted.

Figure 5:
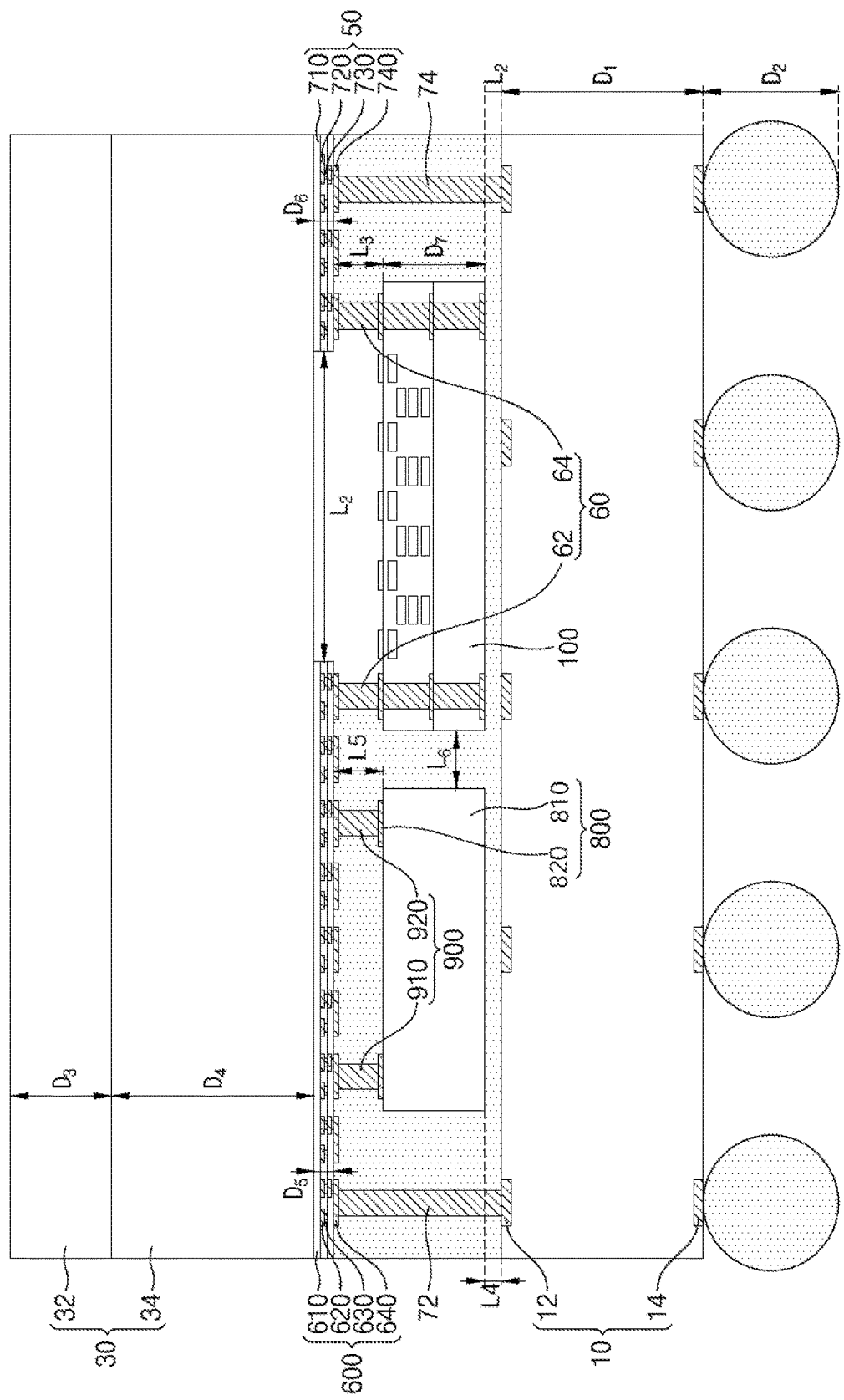
FIG. 5 is a cross-sectional view of an image sensor package according to an embodiment of the present disclosure.

FIG. 5 is a cross-sectional view of an image sensor package according to an embodiment of the present disclosure.

Referring to FIG. 5, an image sensor package 4 may include a base substrate 10, an external connecting terminal 20, a light supplier 30, an image sensor 100, a first connector 60, a second connector 70, a molding part 80, a first redistribution layer 600, a second redistribution layer 700, a memory 800, and a third connector 900.

The base substrate 10, the external connecting terminal 20, the light supplier 30, the image sensor 100, the first connector 60, the second connector 70 and the molding part 80 may be identical or at least similar to the base substrate 10, the external connecting terminal 20, the light supplier 30, the image sensor 100, the first connector 60, the second connector 70 and the molding part 80 of FIGS. 1 to 3, respectively.

The first redistribution layer 600 and the second redistribution layer 700 may be disposed near one edge and near a second edge opposite to the first edge of the light supplier 30, respectively. The first redistribution layer 600 and the second redistribution layer 700 may be identical to the first redistribution layer 40 and the second redistribution layer 50 of FIGS. 1 to 3, respectively, except in that the horizontal length of the first redistribution layer 600 may be greater than the horizontal length of the second redistribution layer 700.

It will be understood that the labeled lengths and distances in the accompanying drawings are specific to each Figure, and that the descriptions and definitions of various labeled lengths and distances of one embodiment in one Figure do not necessarily apply to an embodiment in another Figure.

The memory 800 may be disposed between the base substrate 10 and the first redistribution layer 600. A lower surface of the memory 800 may be vertically spaced apart from an upper surface of the base substrate 10 by a fourth distance L4. For example, the fourth distance L4 may be about equal to or less than 0.1 mm, and may be equal to a second distance L2. An upper surface of the memory 800 may be vertically spaced apart from a lower surface of the first redistribution layer 600 by a fifth distance L5. For example, the fifth distance L5 may be equal to or less than 0.1 mm, and may be equal to a third distance L3. The memory 800 may be horizontally spaced apart from the image sensor 100 by a sixth distance L6. For example, the sixth distance L6 may be 50 to 300 μm. Side and lower surfaces and a part of an upper surface of the memory 800 may be surrounded by the molding part 80.

The memory 800 may include a memory chip 810 and a conductive pad 820. For example, the memory chip 810 may include at least one of: dynamic random access memory (DRAM), static random access memory (SRAM), phase-changeable random access memory (PRAM), magneto-resistive random access memory (MRAM), ferroelectric random access memory (FeRAM), resistive random access memory (RRAM), flash memory, and/or electrically erasable programmable read-only memory (EEPROM).

The conductive pad 820 may be disposed on the memory chip 810. A lower surface of the conductive pad 820 may contact an upper surface of the memory chip 810. The conductive pad 820 may each be disposed at one side of the upper surface and the other side of the upper surface of the memory chip 810.

The third connector 900 may include a first short vertical connecting member 910 and a second short vertical connecting member 920. Each of the first short vertical connecting member 910 and the second short vertical connecting member 920 may be a conductive via.

The first short vertical connecting member 910 may be disposed on the lower surface of the first redistribution layer 600. The first short vertical connecting member 910 may be disposed at an outside portion of the first redistribution layer 600. For example, the outside portion of the first redistribution layer 600 may be disposed further from the image sensor 100 than an inside portion of the redistribution layer 600. The first short vertical connecting member 910 may be disposed between the first redistribution layer 600 and the memory 800. The first short vertical connecting member 910 may electrically interconnect the first redistribution layer 600 and the memory 800. The first short vertical connecting member 910 may electrically interconnect the conductive pad 640 at the outside portion of the first redistribution layer 600 and the conductive pad 820 at one side of the memory 800.

The second short vertical connecting member 920 may be disposed on the lower surface of the first redistribution layer 600. The second short vertical connecting member 920 may be disposed at the inside portion of the first redistribution layer 600. The second short vertical connecting member 920 may be disposed between the first redistribution layer 600 and the memory 800. The second vertical connecting member 910 may electrically interconnect the first redistribution layer 600 and the memory 800. The second short vertical connecting member 920 may electrically interconnect the conductive pad 640 at the inside portion of the first redistribution layer 600 and the conductive pad 820 at the other side of the memory 800.

The memory 800 may receive the processing signal from the image sensor 100 through the first redistribution layer 600 and the third connector 900. The memory 800 may store the processing signal therein. For example, the memory 800 may store the processing signal in the memory chip 810.

FIGS. 6 to 12 are schematic cross-sectional views showing a method for manufacturing an image sensor package in accordance with an embodiment of the present disclosure.

Figure 6:
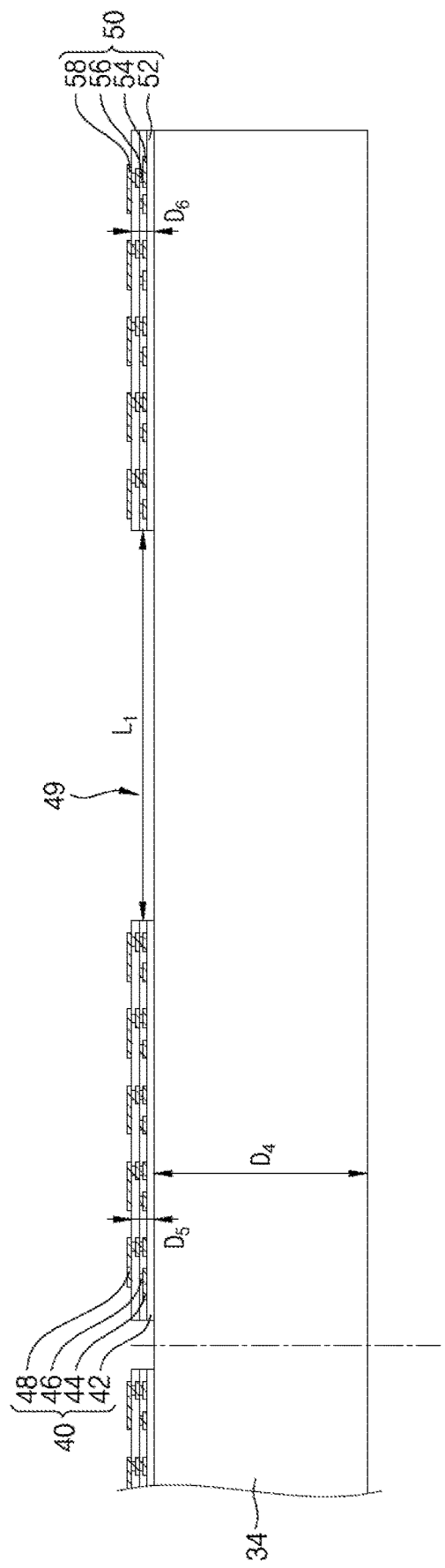
FIGS. 6 to 12 are schematic cross-sectional views showing a method for manufacturing an image sensor package in accordance with an embodiment of the present disclosure.

Referring to FIG. 6, redistribution layers 40 and 50 may be formed on a glass substrate 34.

Although upper and lower surfaces of the glass substrate 34 are illustrated as being flat in the drawing, the glass substrate 34 may be machined to include a convex lens, as shown in FIG. 4A.

An opening 49 may be formed at the redistribution layers 40 and 50 such that a surface of the glass substrate 34 is exposed through the opening 49. The opening 49 may have a quadrangular shape when viewed in a top-down plan view, without necessarily being limited thereto. The redistribution layers 40 and 50 may include a first redistribution layer 40 and a second redistribution layer 50, which are spaced apart from each other at opposite sides of the opening 49. The first redistribution layer 40 and the second redistribution layer 50 may be horizontally spaced apart from each other by a first distance $L_1$. The first redistribution layer 40 and the second redistribution layer 50 may be formed through repeated processes of forming respective insulating layers 42 and 52, forming respective conductive vias 46 and 56 to extend through respective insulating layers 42 and 52, and forming respective wiring patterns 44 and 54 on respective insulating layers 42 and 52 and respective conductive vias 46 and 56. Conductive pads 48 and 58 may be disposed on surfaces of uppermost layers of the insulating layers 42 and 52, respectively. Thereafter, the glass substrate 34 may be cut into pieces having a predetermined size.

Figure 7:
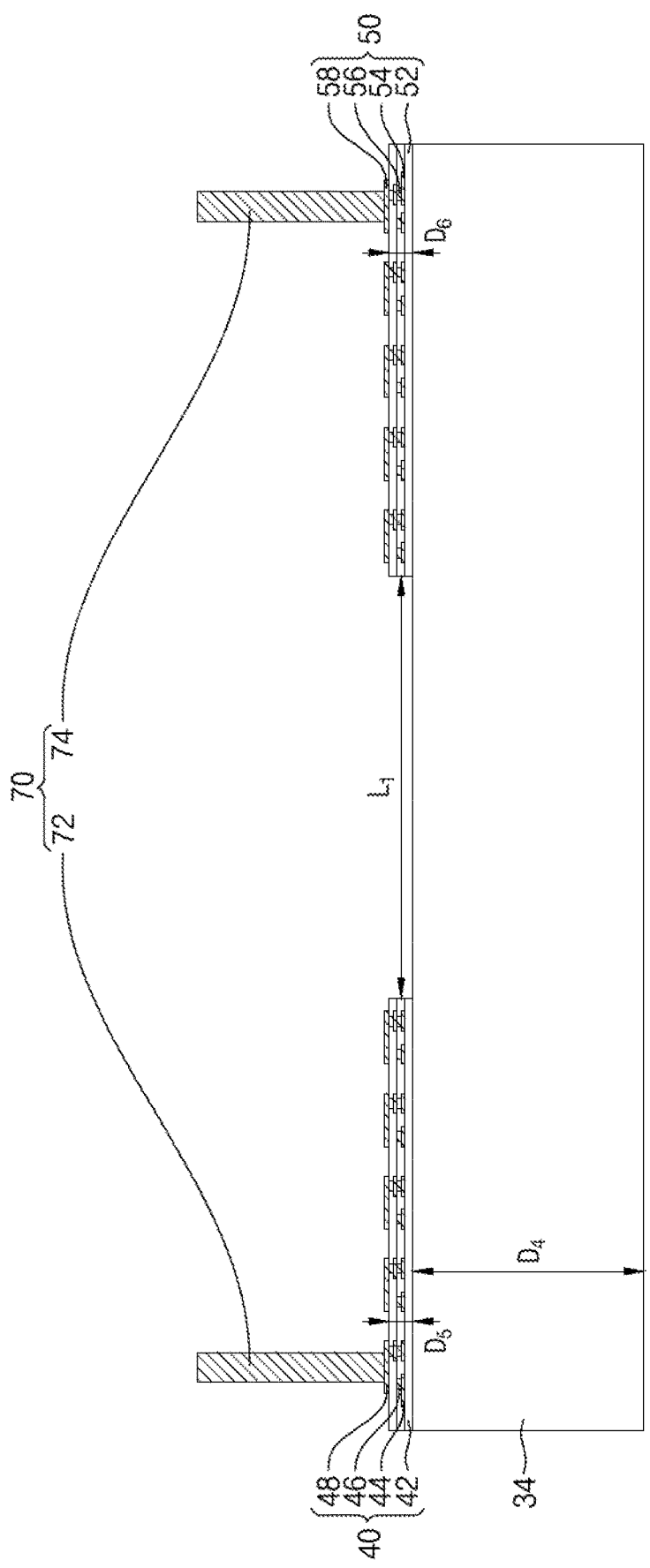

Referring to FIG. 7, a second connector 70 may be disposed on the glass substrate 34. The second connector 70 may be disposed on the first redistribution layer 40 and the second redistribution layer 50. The second connector 70 may include a first long vertical connecting member 72 and a second long vertical connecting member 74. The first long vertical connecting member 72 may be disposed on the first redistribution layer 40, whereas the second long vertical connecting member 74 may be disposed on the second redistribution layer 50. The first long vertical connecting member 72 may be connected to the redistribution pattern 44 at an outside portion of the first redistribution layer 40, whereas the second long vertical connecting member 74 may be connected to the redistribution pattern 54 at an outside portion of the second redistribution layer 50. As used herein, an "inside portion" may refer to any portion closer to the opening 49 and the image sensor 100 than an "outside portion" of the same.

Figure 8:
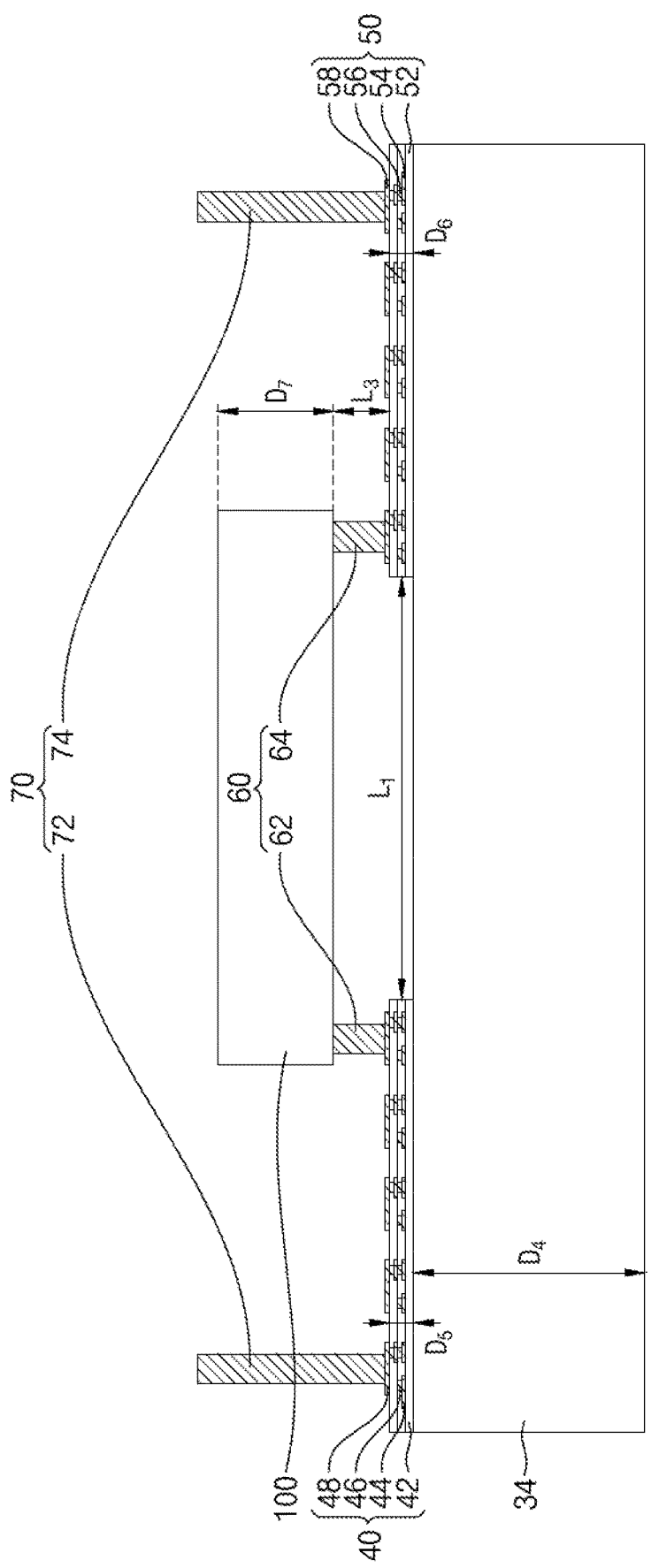

Referring to FIG. 8, an image sensor 100 and a first connector 60 may be disposed on the glass substrate 34. The image sensor 100 may be disposed over the first redistribution layer 40 and the second redistribution layer 50. The image sensor 100 may be vertically spaced apart from the first redistribution layer 40 and the second redistribution layer 50. The image sensor 100 may be spaced apart from the first redistribution layer 40 and the second redistribution layer 50 by a third distance $L_3$ in the vertical direction.

The first connector 60 may include a first vertical connecting member 62 and a second vertical connecting member 64. The first connector 60 may be disposed between the image sensor 100 and the first redistribution layer 40 and between the image sensor 100 and the second redistribution layer 50. The first connector 60 may be disposed on the first redistribution layer 40 and the second redistribution layer 50.

The first vertical connecting member 62 may be disposed on the first redistribution layer 40, whereas the second vertical connecting member 64 may be disposed on the second redistribution layer 50. The first vertical connecting member 62 may be connected to the conductive pad 48 at an inside portion of the first redistribution layer 40, whereas the second vertical connecting member 64 may be connected to the conductive pad 58 at an inside portion of the second redistribution layer 50. The first vertical connecting member 62 may interconnect the first redistribution layer 40 and one side of the image sensor 100. The second vertical connecting member 64 may interconnect the first redistribution layer 40 and the other side of the image sensor 100.

Figure 9:
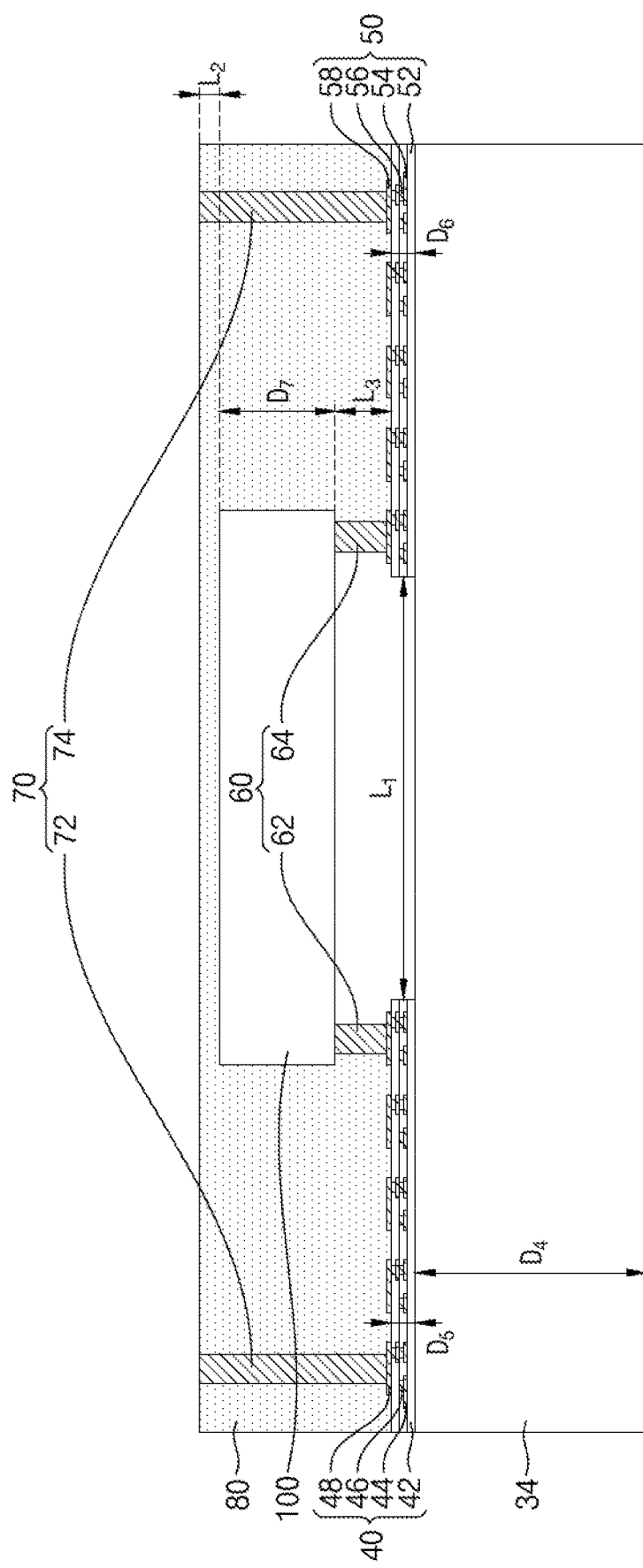

Referring to FIG. 9, a molding part 80 may be formed on the glass substrate 34. The molding part 80 may be formed such that a lower surface thereof covers upper surfaces of the first redistribution layer 40 and the second redistribution layer 50.

The molding part 80 may laterally surround the second connector 70. The molding part 80 may be formed such that an upper surface thereof is coplanar with an upper surface of the second connector 70. The molding part 80 may be aligned with an outer side surface of the first redistribution layer 40 at one side surface thereof while being aligned with an outer side surface of the second redistribution layer 50 at the opposite side surface thereof. The molding part 80 may contact an outer side surface of the first connector 60 and side and upper surfaces of the image sensor 100.

Figure 10:
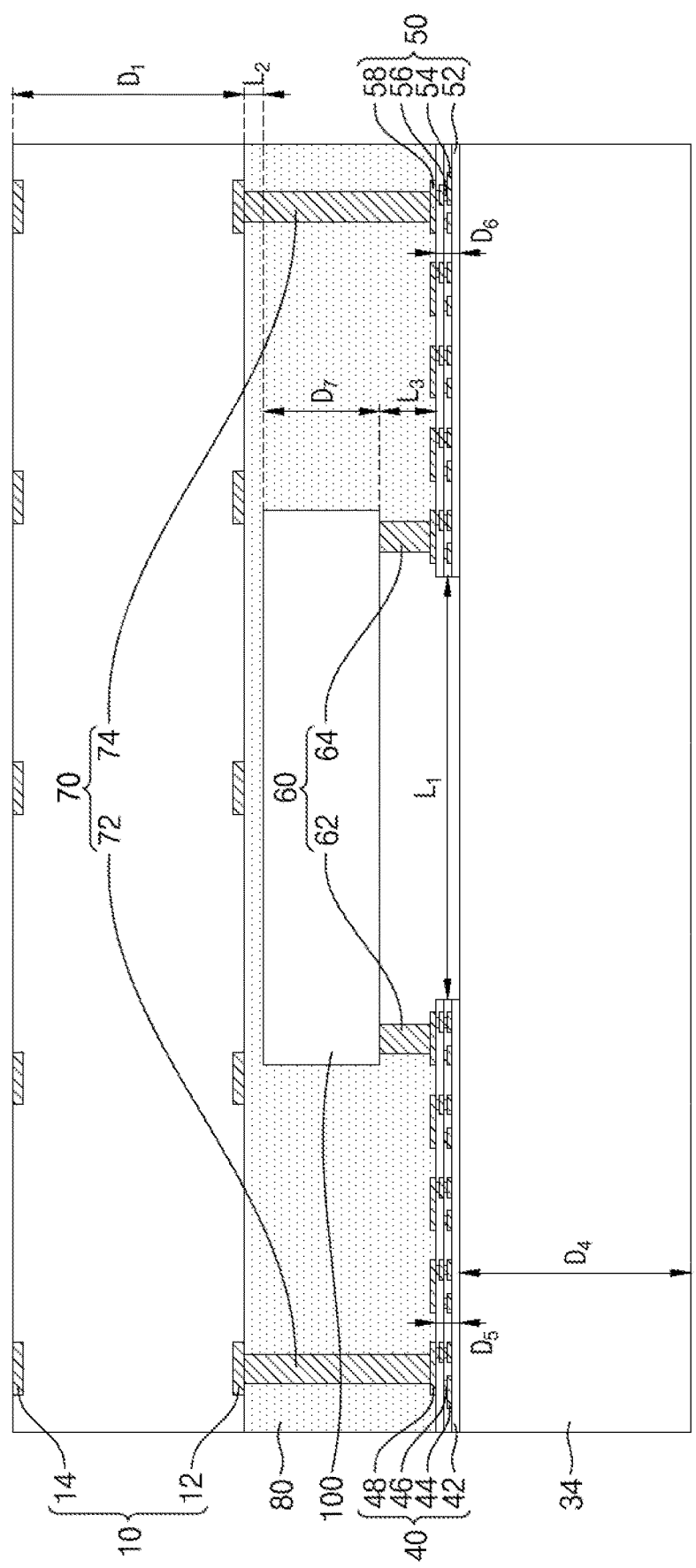

Referring to FIG. 10, a base substrate 10 may be formed. The base substrate 10 may be vertically spaced apart from the image sensor 100 by a second distance $L_2$. The base substrate 10 may be disposed on the molding part 80. A lower surface of the base substrate 10 may contact an upper surface of the molding part 80. Upper pads 12 of the base substrate 10 may be connected to the second connector 70. The upper pad 12 at one side of the base substrate 10 may be connected to the first long vertical connecting member 72, whereas the upper pad at the other side of the base substrate 10 may be connected to the second long vertical connecting member 74.

Figure 11:
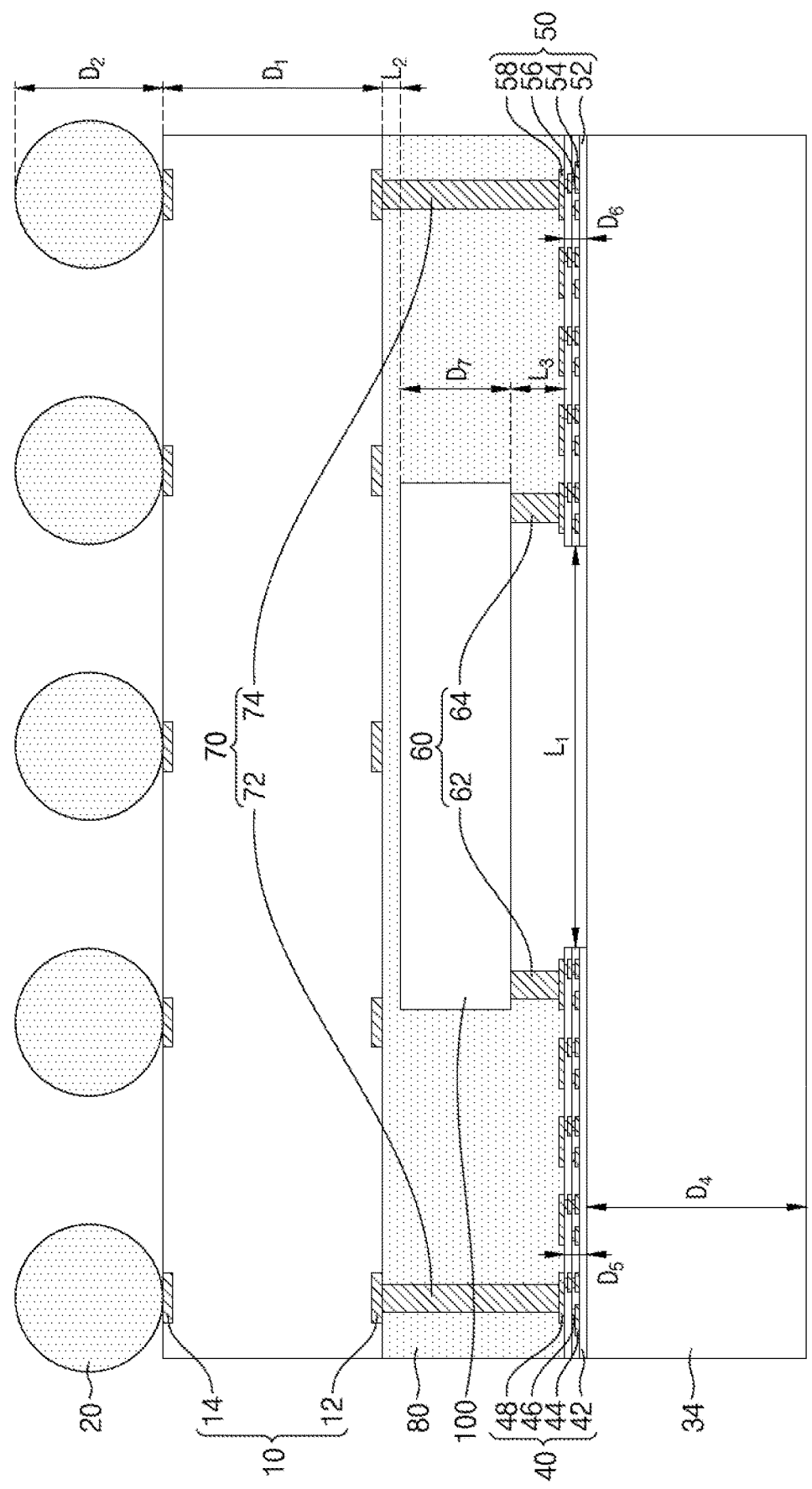

Referring to FIG. 11, an external connecting terminal 20 may be disposed. The external connecting terminal 20 may be disposed on the base substrate 10. The external connecting terminal 20 may be connected to a lower pad 14 of the base substrate 10.

Figure 12:
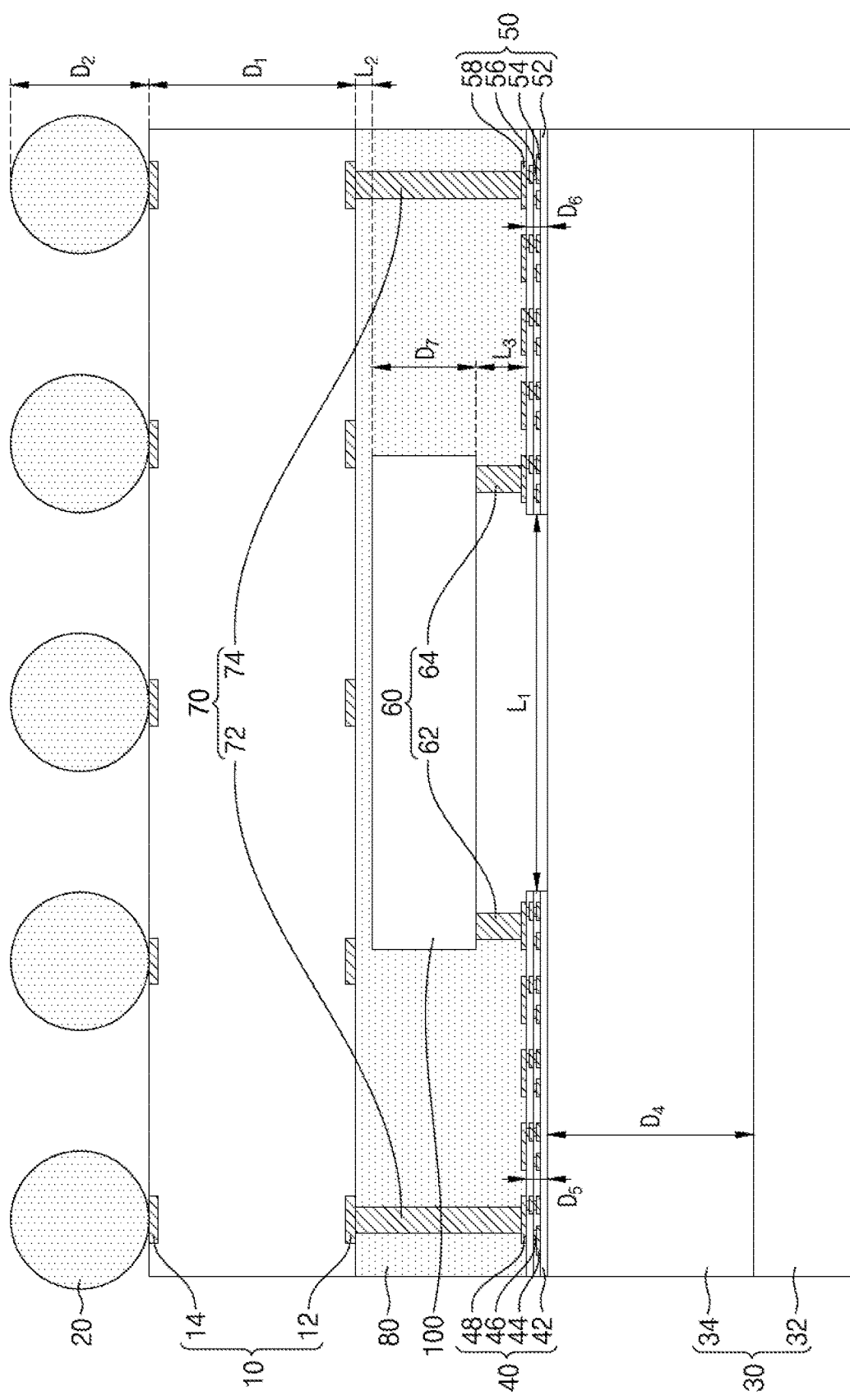

Referring to FIG. 12, an optical filter 32 may be disposed. The optical filter 32 may be disposed under the glass substrate 34. An upper surface of the optical filter 32 may contact a lower surface of the glass substrate 34. When the glass substrate 34 is formed into a certain shape, the optical filter 32 may similarly be formed in accordance with the shape of the glass substrate 34. For example, when the glass substrate 34 performs the function of a convex lens, a portion of the optical filter 32 corresponding to the convex lens may have a shape convex in a direction opposite to the image sensor 100. When the glass substrate 34 performs the function of a concave lens, a portion of the optical filter 32 corresponding to the concave lens may have a shape concave toward the image sensor 100.

FIGS. 13 to 16 are schematic cross-sectional views showing a method for manufacturing an image sensor package in accordance with an embodiment of the present disclosure.

Figure 13:
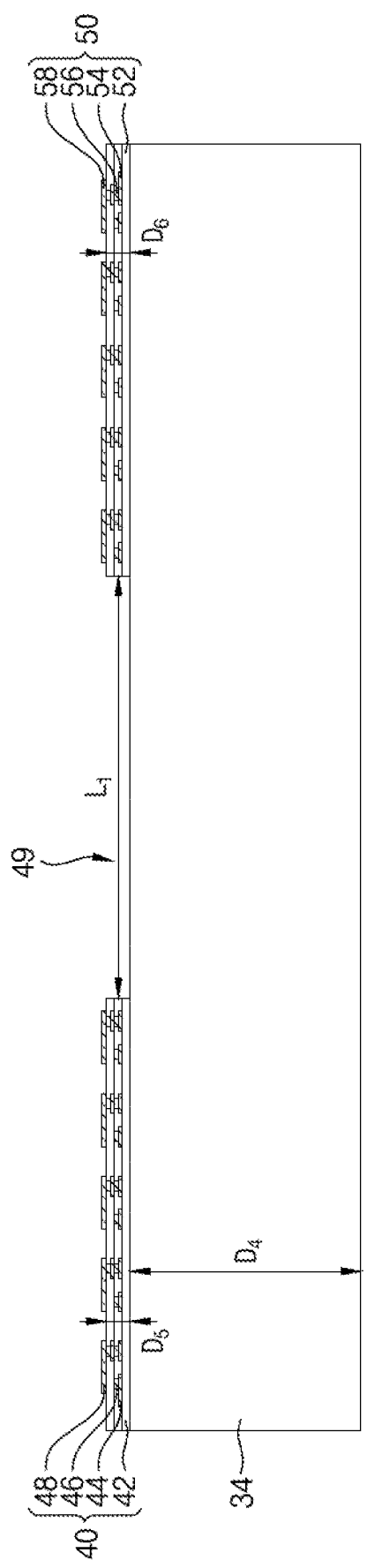

Referring to FIG. 13, a first redistribution layer 40 and a second redistribution layer 50 may be disposed. The first redistribution layer 40 and the second redistribution layer 50 may be disposed through the same methods described above with reference to FIG. 6.

Figure 14:
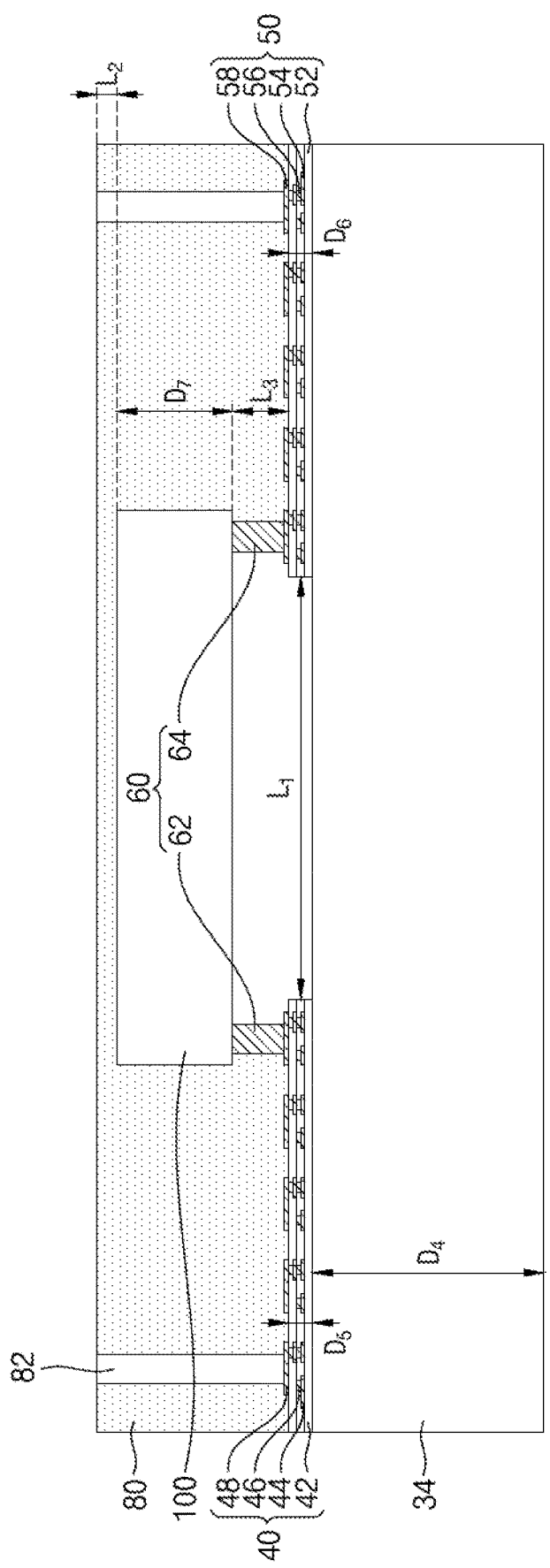

Referring to FIG. 14, a first connector 60, a molding part 80 and an image sensor 100 may be disposed. The first connector 60 and the image sensor 100 may be disposed through the same methods described above with reference to FIG. 7.

The molding part 80 may be aligned with an outer side surface of the first redistribution layer 40 at one outer side surface thereof, and may be aligned with an outer side surface of the second redistribution layer 50 at the opposite outer side surface thereof. The molding part 80 may be disposed such that an inner side surface thereof contacts an outer side surface of the first connector 60 and side and upper surfaces of the image sensor 100.

A cavity 82 may be formed at the molding part 80. The cavity 82 may extend through the molding part 80. The cavity 82 may extend from each upper surface of the first redistribution layer 40 and the second redistribution layer 50 to an upper surface of the molding part 80. The cavity 82 may partially expose each of the first redistribution layer 40 and the second redistribution layer 50.

Figure 15:
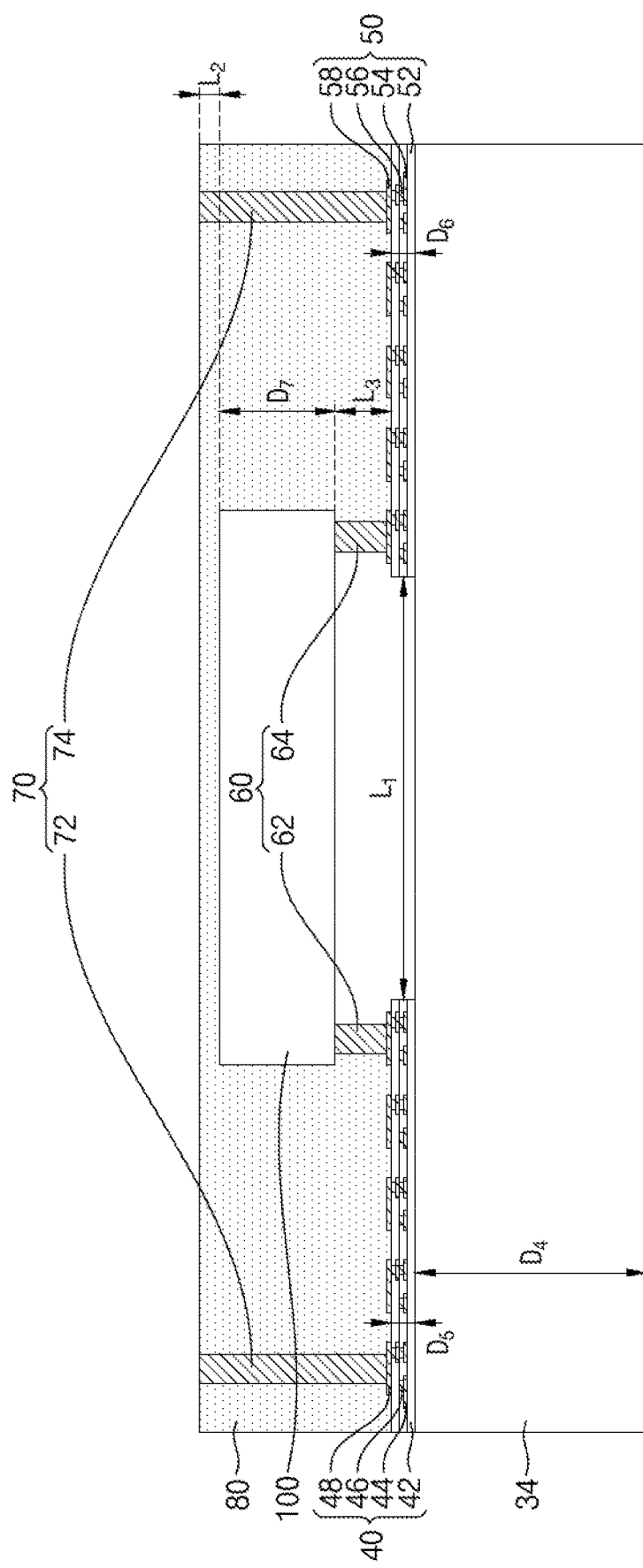

Referring to FIG. 15, a second connector 70 may be formed in the cavity 82. The second connector 70 may fill the cavity 82. A first long vertical connecting member 72 may be disposed in the cavity 82, which is formed at one side, whereas a second long vertical connecting member 74 may be disposed in the cavity 82, which is formed at the opposite side.

Referring to FIG. 16, a base substrate 10, an external connecting terminal 20 and an optical filter 32 may be disposed. The base substrate 10, the external connecting terminal 20 and the optical filter 32 may be disposed through the same methods as described above with reference to FIGS. 10 to 12.

In accordance with embodiments of the disclosure, an image sensor package and an image sensor module including the same may have reduced thicknesses.

In accordance with embodiments of the disclosure, process costs may be reduced, and bonding force of a glass substrate may be enhanced.

In accordance with embodiments of the disclosure, the relative aperture of the image sensor package may be adjusted in accordance with the thickness of a glass substrate and the distance between redistribution layers.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. An image sensor package comprising:
   a glass substrate configured to focus incident light;
   a first redistribution layer disposed under the glass substrate and a second redistribution layer disposed under the glass substrate, wherein the first redistribution layer and the second redistribution layer are horizontally spaced apart from each other by a first distance;
   an image sensor disposed such that an upper surface of the image sensor is vertically spaced apart from a lower surface of the first redistribution layer by a second distance, and vertically spaced apart from a lower surface of the second redistribution layer by the second distance; and
   a first connector, wherein the first connector comprises a first vertical connecting member disposed between the first redistribution layer and the image sensor and a second vertical connecting member disposed between the second redistribution layer and the image sensor, and wherein the first vertical connecting member and the second vertical connecting member connect the first redistribution layer and the second redistribution layer to the image sensor, respectively,
   wherein a thickness of the glass substrate is 0.6 to 0.8 mm,
   wherein the first distance is less than a horizontal length of the image sensor by 50 μm to 500 μm, and
   wherein the second distance is 0.1 mm or less.

2. The image sensor package according to claim 1, wherein:
   an upper surface of the glass substrate is convex in a direction opposite to the image sensor, and a lower surface of the glass substrate is convex toward the image sensor; and
   a focal length of the glass substrate increases as a thickness of the glass substrate increases.

3. The image sensor package according to claim 1, wherein:
   an upper surface of the glass substrate is concave toward the image sensor, and a lower surface of the glass substrate is convex in a direction opposite to the image sensor; and
   a focal length of the glass substrate decreases as a thickness of the glass substrate increases.

4. The image sensor package according to claim 1, further comprising:
   an optical filter disposed on the glass substrate,
   wherein a thickness of the optical filter is 0.5 mm or less.

5. The image sensor package according to claim 4, wherein the optical filter comprises an infrared filter.

6. The image sensor package according to claim 1, wherein a relative aperture of the image sensor package is adjusted in accordance with the first distance.

7. The image sensor package according to claim 1, wherein a thickness of the first redistribution layer is 0.01 to 0.05 mm, and a thickness of the second redistribution layer is 0.01 to 0.05 mm.

8. The image sensor package according to claim 1, wherein a thickness of the image sensor is 0.2 to 0.4 mm.

9. The image sensor package according to claim 1, wherein the image sensor comprises:
   an image sensor chip; and
   a processor.

10. The image sensor package according to claim 9, wherein the image sensor chip comprises:
    a substrate;
    a photoelectric conversion layer formed in the substrate; and
    a color filter disposed on the substrate.

11. The image sensor package according to claim 1, further comprising:
    a molding part disposed outside the image sensor such that a first side surface of the molding part and a second side surface of the molding part opposite to the first side surface of the molding part are aligned with a first side surface of the first redistribution layer and a second side surface of the second redistribution layer opposite to the first side surface of the second redistribution layer, respectively, and a portion of an inner side surface of the molding part contacts side and lower surfaces of the image sensor.

12. The image sensor package according to claim 11, wherein a thickness of the molding part is 0.1 to 0.5 mm.

13. An image sensor package comprising:
    a glass substrate configured to focus incident light;
    a first redistribution layer disposed under the glass substrate and a second redistribution layer disposed under the glass substrate, wherein the first redistribution layer and second redistribution layer are horizontally spaced apart from each other;
    an image sensor disposed such that an upper surface thereof is vertically spaced apart from a lower surface of the first redistribution layer by a first distance, and such that the upper surface of the image sensor is vertically spaced apart from a lower surface of the second redistribution layer by the first distance;
    a memory vertically spaced apart from the lower surface of the first redistribution layer by a second distance, wherein the memory is horizontally spaced apart from the image sensor by a third distance;
    a first connector, wherein the first connector comprises a first connecting member disposed between the first redistribution layer and the image sensor and a second connecting member disposed between the second redistribution layer and the image sensor, and wherein the first connecting member and the second connecting member connect the first redistribution layer and the second redistribution layer to the image sensor, respectively; and
    a second connector disposed between the first redistribution layer and the memory to connect the first redistribution layer to the memory,
    wherein the first distance is 0.1 mm or less, the second distance is 0.1 mm or less, and
    wherein the third distance is 50 to 300 μm.

14. The image sensor package according to claim 13, wherein a horizontal length of the first redistribution layer is greater than a horizontal length of the second redistribution layer.

15. The image sensor package according to claim 13, wherein the memory comprises:
a memory chip; and
a conductive pad disposed on the memory chip such that the conductive pad is connected to the first connector.

16. The image sensor package according to claim 13, further comprising:
a base substrate vertically spaced apart from a lower surface of the image sensor and a lower surface of the memory by a fourth distance and a fifth distance, respectively.

17. The image sensor package according to claim 16, wherein the fourth distance is 0.1 mm or less, and wherein the fifth distance is 0.1 mm or less.

18. An image sensor package comprising:
a base substrate;
an external connecting terminal disposed under the base substrate;
an optical filter disposed on the base substrate;
a glass substrate disposed under the optical filter;
a first redistribution layer disposed under the glass substrate and a second redistribution layer disposed under the glass substrate, wherein the first redistribution layer and the second redistribution layer are horizontally spaced apart from each other by a first distance;
an image sensor disposed such that a lower surface of the image sensor is vertically spaced apart from an upper surface of the base substrate by a second distance, and an upper surface of the image sensor is vertically spaced apart from a lower surface of the second redistribution layer by a third distance;
a first connector, wherein the first connector comprises a first connecting member disposed between the first redistribution layer and the image sensor and a second connecting member disposed between the second redistribution layer and the image sensor, and wherein the first connecting member and the second connecting member connect the first redistribution layer and the second redistribution layer to the image sensor, respectively;
a second connector disposed outside the image sensor, to interconnect the base substrate, the first redistribution layer, and the second redistribution layer; and
a molding part disposed outside the image sensor such that a first side surface of the molding part and a second side surface of the molding part opposite to the first side surface of the molding part are aligned with a first side surface of the first redistribution layer and a second side surface of the second redistribution layer opposite to the first side surface of the first redistribution layer, respectively, wherein a portion of an inner side surface of the molding part contacts side surfaces and a lower surface of the image sensor,
wherein a lower surface of the optical filter is convex in a direction toward the image sensor or in a direction opposite to the image sensor, and wherein a lower surface of the glass substrate is convex in a direction toward the image sensor or in a direction opposite to the image sensor, and
wherein the first distance is less than a horizontal length of the image sensor by 50 μm to 500 μm.

19. The image sensor package according to claim 18, wherein:
the second distance is 0.1 mm or less, and the third distance is 0.1 mm or less.

20. The image sensor package according to claim 18, wherein:
a thickness of the base substrate is 0.5 to 0.7 mm;
a thickness of the external connecting terminal is 0.3 to 0.5 mm;
a thickness of the optical filter is equal to or less than 0.5 mm;
a thickness of the glass substrate is 0.6 to 0.8 mm;
a thickness of the first redistribution layer is 0.01 to 0.05 mm;
a thickness of the second redistribution layer is 0.01 to 0.05 mm;
a thickness of the image sensor is 0.2 to 0.4 mm; and
a thickness of the molding part is 0.1 to 0.5 mm.

* * * * *